United States Patent
Chen et al.

(10) Patent No.: US 11,289,423 B2
(45) Date of Patent: Mar. 29, 2022

(54) ULTRA-THIN DIFFUSION BARRIER

(71) Applicant: Purdue Research Foundation, West Lafayette, IN (US)

(72) Inventors: Zhihong Chen, West Lafayette, IN (US); Chun-Li Lo, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/438,093

(22) Filed: Jun. 11, 2019

(65) Prior Publication Data

US 2020/0395311 A1 Dec. 17, 2020

(51) Int. Cl.
*H01L 23/532* (2006.01)
*H01L 21/768* (2006.01)

(52) U.S. Cl.
CPC .. *H01L 23/53238* (2013.01); *H01L 21/76802* (2013.01); *H01L 21/76843* (2013.01); *H01L 21/76846* (2013.01); *H01L 21/76847* (2013.01); *H01L 21/76877* (2013.01); *H01L 23/53266* (2013.01)

(58) Field of Classification Search
CPC ......... H01L 23/53238; H01L 23/53266; H01L 21/76843; H01L 21/76802; H01L 21/76844; H01L 21/76846; H01L 21/76877; H01L 21/76847
See application file for complete search history.

(56) References Cited

U.S. PATENT DOCUMENTS

| | | | | |
|---|---|---|---|---|
| 5,369,333 | A * | 11/1994 | Inoguchi | H05B 33/145 313/509 |
| 9,831,427 | B1 * | 11/2017 | Haase | H01L 45/146 |
| 2008/0012133 | A1 * | 1/2008 | Shih | H01L 21/76856 257/751 |
| 2010/0187693 | A1 * | 7/2010 | Mountsier | H01L 21/76864 257/751 |
| 2016/0240376 | A1 * | 8/2016 | Yeh | C23C 16/482 |
| 2017/0033003 | A1 * | 2/2017 | Song | H01L 23/53266 |

OTHER PUBLICATIONS

Le et al., Single layer MoS_2 on the Cu(111) surface: First principles electronic structure calculations, Phys. Rev. B Condens. Matter Mater. Phys., 2012, 075429-1-075429-5, vol. 85, American Physical Society.

Lane et al., Relationship between interfacial adhesion and electromigration in Cu metallization, Journal of Applied Physics, 2003, 1417-1421, vol. 93, American Institute of Physics.

(Continued)

*Primary Examiner* — Aaron J Gray
(74) *Attorney, Agent, or Firm* — Piroozi-IP, LLC

(57) ABSTRACT

A metal interconnect arrangement in an integrated circuit, includes a damascene trench which includes a dielectric base, with a trench made therein, one or more two dimensional diffusion barrier layers formed over the trench, a conductor layer formed atop the diffusion layer, wherein the one or more two-dimensional diffusion barrier layers substantially prevent diffusion of constituents of the conductor layer into the dielectric base.

6 Claims, 13 Drawing Sheets

(56) References Cited

OTHER PUBLICATIONS

Chan et al., Diffusion studies of copper on ruthenium thin film, Electrochemical Solid-State Letters, 2004, G154-G157, vol. 7, No. 8, The Electrochemical Society.

J.W. McPherson, Time dependent dielectric breakdown physics Models revisited, Microelectronics Reliability, 2012, 1753-1760, vol. 52, Elsevier Ltd.

Zhao et al., Direct observation of the 1/E dependence of time dependent dielectric breakdown in the presence of copper, Applied Physics Letters, 2011, 032107-1-032107-3, vol. 98, AIP Publishing.

Suzumura et al., A new TDDB degradation model based on Cu ion drift in Cu interconnect dielectrics, IRPS, 2006, 484-489, IEEE, San Jose, CA, USA.

Croes et al., Comparison between intrinsic and integrated reliability properties of low-k materials, IRPS, 2011, 142-148, IEEE.

Junji Noguchi, Dominant factors in TDDB degradation of Cu interconnect, IEEE Transactions on Electron Devices, 2005, 1743-1750, vol. 52, No. 8, IEEE.

Nazon et al., Copper diffusion in TaN-based thin layers, Applied Surface Science, 2008, 5670-5674, vol. 254, Elsevier B.V.

Lin et al., Grain boundary diffusion of copper in tantalum nitride thin films, Journal of The Electrochemical Society, 1999, 3466-3471, vol. 146, No. 9, The Electrochemical Society, Inc.

Wang et al., Copper diffusion characteristics in single crystal and polycrystalline TaN, Mat. Res. Soc. Symp. Proc., 2003, N6.11.1 N6.11.6, vol. 745, Materials Research Society.

Zou et al., Predicting dislocations and grain boundaries in two dimensional metal disulfides from the First Principles, Nano Letters, 2013, 253-258, vol. 13, ACS Publications.

Liu et al., Cones, pringles, and grain boundary landscapes in graphene topology, Nano Letters, 2010, 2178-2183, vol. 10, ACS Publications.

Liu et al., Dislocations and grain boundaries in two dimensional boron nitride, ACS Nano, 2012, 7053-7058, vol. 6, No. 8, ACS Publications.

Zemlyanov et al., Versatile technique for assessing thickness of 2D layered materials by Versatile technique for assessing thickness of 2D layered materials by XPS, Nanotechnology, 2018, 115705, vol. 29, IOP Publishing Ltd.

Herrera-Gómez et al., Chemical depth profile of ultrathin nitrided $SiO_2$ films, Applied Physics Letters, 2002, 1014-1016, vol. 81, No. 6, American Institute of Physics.

Kresse et al., Ab initio molecular dynamics for liquid metal, Rapid Communications: Physical Review B, 1993, 558-561, vol. 47, No. 1.

Kresse et al., Efficient iterative schemes for ab initio total energy calculations using a plane wave basis set, Physical Review B, 1996, 169-186, vol. 54, No. 6, The American Physical Society.

Kresse et al., From ultrasoft pseudopotentials to the projector augmented wave method, Physical Review B, 1999, 1758-1775, vol. 59, No. 3, The American Physical Society.

Perdew et al., Generalized gradient approximation made simple, Physical Review Letters, 1996, 3865-3868, vol. 77, No. 18, The American Physical Society.

Stefan Grimme, Semiempirical GGA type density functional constructed with a long range dispersion correction, Journal of Computational Chemistry, 2006, 1787-1799, vol. 27, No. 15, Wiley Periodicals, Inc.

Edelstein et al., A High Performance Liner for Copper Damascene Interconnects, Proc. IEEE Int. Interconnect Technol. Conf., 2001, 9-11, IEEE, Yorktown Heights, New York.

Wang et al., The Reliability Improvement of Cu Interconnection by the Control of Crystallized a-Tan/TaN_x Diffusion Barrier, Journal of Nanomaterials, 2015, 1-6, Hindawi Publishing Corporation.

Wu et al., PVD-Treated ALD TaN for Cu Interconnect Extension to 5nm Node and Beyond, Proc. IEEE Int. Interconnect Technol. Conf., 2018, 149-151, IEEE, Santa Clara, CA, USA.

Nguyen et al., 1-nm thick graphene tri layer as the ultimate copper diffusion barrier, Applied Physics Letters, 2014, 082105-1-082105-5, vol. 104, AIP Publishing LLC.

Hong et al., Graphene as an atomically thin barrier to Cu diffusion into Si, Nanoscale, 2014, 7503-7511, vol. 6, The Royal Society of Chemistry.

Bong et al., Ultrathin graphene and graphene oxide layers as a diffusion barrier for advanced Cu metallization, Applied Physics Letters, 2015, 063112-1-063112-5, vol. 106, AIP Publishing LLC.

Li et al., Cu diffusion barrier: graphene benchmarked to TaN for ultimate interconnect scaling, 2015 Symposium on VLSI Technology Digest of Technical Papers, 2015, T122-T123.

Li et al., Vertical and Lateral Copper Transport through Graphene Layers, ACS Nano, 2015, 8361-8367, vol. 9, No. 8, American Chemical Society.

Mehta et al., Transfer free multi layer graphene as a diffusion barrier, Nanoscale, 2017, 1827-1833, American Chemical Society.

Lo et al., Studies of two dimensional h-BN and MoS_2 for potential diffusion barrier application in copper interconnect technology, npj 2D Material Applications, 2017, vol. 1, No. 42, FCT NOVA and E-MRS.

Lo et al., BEOL compatible 2D layered materials as ultra thin diffusion barriers for Cu interconnect technology, Conf. Dig. DRC, 2017, IEEE.

Lo et al., Large area, single layer molybdenum disulfide synthesized at BEOL compatible temperature as Cu diffusion barrier, IEEE Electron Device Letters, 2018, 873-876, vol. 39, No. 6, IEEE.

Mehta et al., Enhanced electrical and thermal conduction in graphene encapsulated copper nanowires, Nano Letters, 2015, 2024-2030, vol. 15, American Chemical Society.

Shen et al., Studies of two dimensional MoS2 on enhancing the electrical performance of ultrathin copper films, 2018, 1-13.

Chugh et al., Comparison of graphene growth on arbitrary non catalytic substrates using low temperature PECVD, Carbon, 2015, 393-399, vol. 93, Elsevier Ltd.

Ahn et al., Low temperature synthesis of large scale molybdenum disulfide thin films directly on a plastic substrate using plasma enhanced chemical vapor deposition, Adv. Materials, 2015, 5223-5229, vol. 27, Wiley-VCH Verlag GmbH & Co. KGaA, Weinheim.

Perini et al., Low temperature, plasma assisted, cyclic synthesis of MoS_2, Journal of Vacuum Science & Technology B, Nanotechnology and Microelectronics: Materials, Processing, Measurement, and Phenomena, 2018 031201-1-031201-12, vol. 36, No. 3, AVS.

Zhao et al., Two dimensional tantalum disulfide: Controlling structure and properties via synthesis, 2D Materials, 2018, 1-6, vol. 5, IOP Publishing Ltd.

Shi et al., Two dimensional metallic tantalum disulfide as a hydrogen evolution catalyst, Nature Communications, 2017, 1-9, vol. 8, No. 958.

* cited by examiner

ULTRA-THIN DIFFUSION BARRIER

STATEMENT REGARDING GOVERNMENT FUNDING

This invention was not made with Government Support.

TECHNICAL FIELD

The present disclosure generally relates to placement of interconnect metal in integrated circuits, and in particular, to placement of copper and an associated ultra-thin diffusion barrier.

BACKGROUND

This section introduces aspects that may help facilitate a better understanding of the disclosure. Accordingly, these statements are to be read in this light and are not to be understood as admissions about what is or is not prior art.

Copper is preferred to aluminum for choice of material for interconnect metals in integrated circuits owing to its higher conductivity. However, while aluminum can be deposited using typical deposition processes, copper is typically deposited using an electroplating process. In doing so, trenches (typically called Damascene) are made into oxide and copper is then deposited into the trenches. Any over-deposition of copper (typically referred to as overburden) is removed using various techniques (e.g., chemical-mechanical planarization (CMP)). One issue with deposition of copper in these trenches is diffusion of copper atoms into the oxide layer generating traps deep into the oxide, thereby degrading the insulating properties of the oxide. In particular, copper diffusion into the dielectric between two interconnects can cause shorting and create chip failures, while diffusion to transistors can introduce deep-level traps to Si and affect overall transistor performance.

To prevent this phenomenon, prior to deposition of copper, a diffusion barrier layer is placed on the trenches. The diffusion barrier layer prevents diffusion of copper atoms into the oxide. The diffusion layer must have at least three properties: 1) provide a chemical barrier for copper atoms to diffuse into the oxide layer, 2) provide high electrical conductivity between the oxide and the later-deposited copper layer, and 3) be as thin as possible, since the electrical conduction of copper is directly proportional to its thickness (cross-sectional area) and thicker diffusion barrier layer means thinner copper. The diffusion barrier layer needs to be provided on all sides of the copper deposited to prevent the aforementioned deleterious effects. While aluminum also required a diffusion barrier layer, such was not required on all sides. Therefore, with copper, the diffusion barrier layer results in a significant lowering of the available copper that can be deposited.

Traditionally, various materials are used to provide a diffusion barrier layer. One such material is TaN which is placed on the trench as a diffusion barrier layer, but because of its poor adhesion to Cu a layer of Ta is then deposited on the TaN. The typical overall thickness of the diffusion barrier-adhesion layer can range to 4-5 nm. This thickness poses a serious challenge, since as mentioned above, more of TaN means less copper, and hence less conduction.

As geometries shrink, available thickness for copper as a choice for the interconnect material becomes more tenuous. In particular, the aforementioned challenges are exasperated since the interconnect half-pitch size will reach about 20 nm in the coming sub-5 nm technology node. Meanwhile, the TaN/Ta diffusion barrier-adhesion layer stack has to be greater than 4 nm to provides acceptable properties for both limiting diffusion as well as enhancing adhesion (i.e., anything thinner will suffer from proper diffusion barrier properties for which the layers are used). However, as alluded to above, since the diffusion layer-adhesion layer of TaN/Ta result in a significant available volume of the interconnect cross-section, little is left for copper as the interconnect metal, thus preventing shrinking geometries to a desirable scale (e.g., sub-5 nm scale).

Past attempt to deposit thinner diffusion layers of TaN using atomic-layer-deposition (ALD) have resulted in diffusion layers that provide less than desirable performance. Along the same line, 2D structures (i.e., atomically deposited material) have also been investigated in the prior art such as graphene, molybdenum disulfide ($MoS_2$), and hexagonal boron nitride (h-BN), however, these materials are deposited utilizing processes such as chemical vapor deposition with deposition temperatures that prove to be deleterious for other structures requiring a metallic substrate and follow-on transfer from the metallic substrate to the dielectric substrate which present additional challenges making such approaches unpractical.

Therefore, there is an unmet need for a novel approach to replace exiting diffusion barrier-adhesion barrier with a new one that meets the goals listed above.

SUMMARY

A metal interconnect arrangement in an integrated circuit is disclosed. The metal interconnect arrangement includes a damascene trench. The damascene trench includes a dielectric base, with a trench made therein. The damascene trench further includes one or more two dimensional diffusion barrier layers formed over the trench. The damascene trench further includes a conductor layer formed atop the diffusion layer. The one or more two-dimensional diffusion barrier layers substantially prevent diffusion of constituents of the conductor layer into the dielectric base.

A method of providing a barrier to diffusion of metal into a dielectric in a metal interconnect arrangement is also disclosed. The method includes forming a damascene trench which includes forming a dielectric base, with a trench made therein. The formation of the damascene trench further includes depositing one or more two dimensional diffusion barrier layers formed over the trench. The formation of the damascene trench further includes depositing a conductor layer formed atop the diffusion layer. The one or more two-dimensional diffusion barrier layers substantially prevent diffusion of constituents of the conductor layer into the dielectric base.

DETAILED DESCRIPTION

Figure 1:
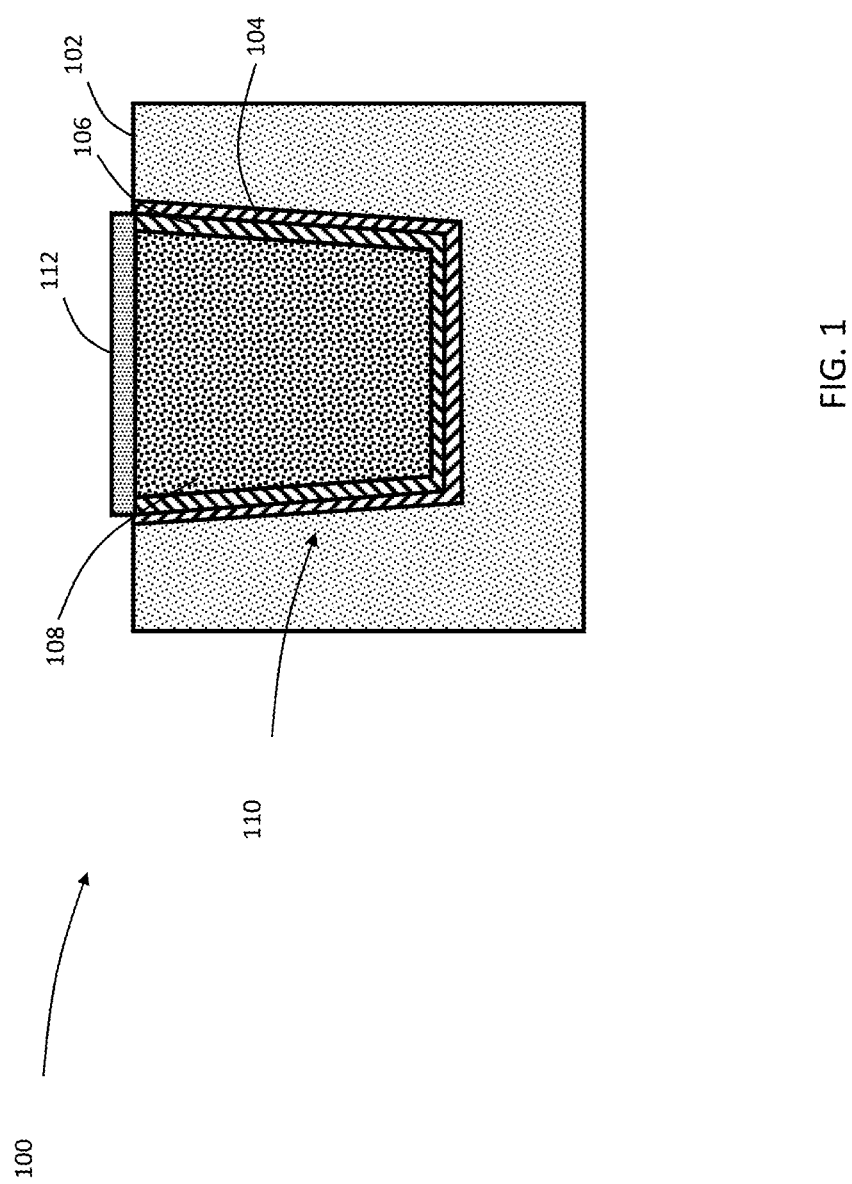
FIG. 1 is a cross-sectional view of a damascene trench within a dielectric with a three-dimensional bilayer diffusion barrier layer/adhesion layer (barrier/liner) and an interconnect metal deposited therein and capped with a capping layer.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach to replace exiting diffusion barrier-adhesion barrier with a new structure that meets the following goals is presented in the present disclosure: 1) provide a chemical barrier thereby preventing copper atoms from diffusing into the surrounding oxide layer, 2) provide high electrical conductivity between the oxide and the later-deposited copper layer, and 3) be ultra-thin so that more copper can be deposited resulting in higher conduction. To this end, the present disclosure presents use of $TaS_x$ as one or more two dimensional diffusion barrier layers as a replacement diffusion barrier layer which has been shown to be as low as 0.7 nm in comparison to 4-5 nm of existing three-dimensional diffusion barrier layers (e.g., TaN as a diffusion barrier layer with Ta deposited on TaN for additional adhesion). According to the present disclosure, then, the 2D layered of tantalum sulfide ($TaS_x$) with a thickness of about 0.7 nm thickness is developed that can be deposited using a single or more layers (e.g., two layers each providing about 0.7 nm thickness) to replace the conventional TaN/Ta bilayer. The $TaS_x$ ultra-thin film is compatible with traditional integrated circuit fabrication processes and based on the methods discussed herein can be directly deposited on dielectrics thereby removing the need to detach from an interim substrate and placement on the final substrate. Results presented in the present disclosure provide superior diffusion barrier qualities (at least about as good as TaN or Ta), while allowing a significant more volume of copper as the interconnect metal in the interconnect channel. The $TaS_x$ 2D material discussed in the present disclosure further provides superior adhesion to copper (at least as good as Ta), thus eliminating the need for additional adhesion layers (e.g., Ta). As a result, the $TaS_x$ structure of the present disclosure provides additional runway for interconnects for smaller geometries (e.g., beyond the 5 nm scaling).

Figure 2:
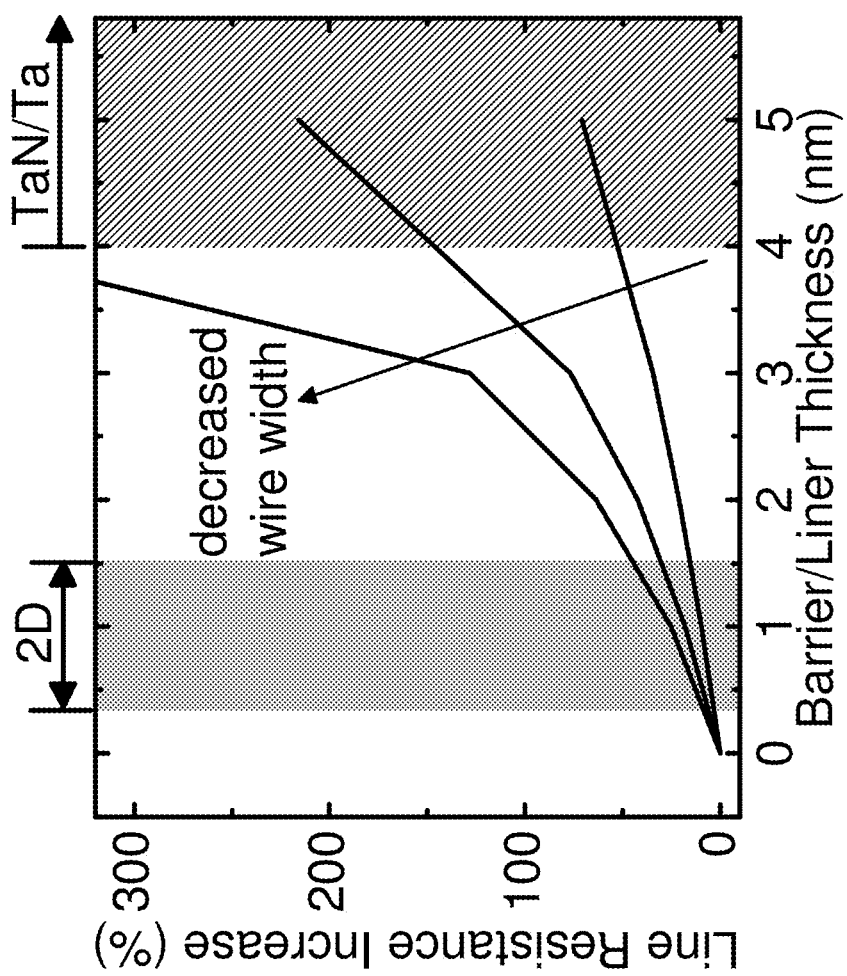
FIG. 2 is a graph of line resistance increase (%) as a function of barrier/liner thickness (nm) for interconnect widths in nm.

Referring to FIG. 1, a cross-sectional view of a traditional damascene trench 100 within oxide 102 is shown with a bilayer TaN—Ta diffusion barrier layer (barrier/line) 110 including a barrier layer of TaN 104 and an adhesion layer 106 with the copper 108 deposited therein and capped with a capping layer 112. As discussed for 5 nm technology, the thickness (therefore, the cross-sectional area) of the copper interconnect 108 is on the same order as the bilayer 110, resulting in a significantly higher resistance. This relationship is shown in FIG. 2, which is a graph of line resistance increase (%) as a function of barrier/liner thickness (nm) for interconnect widths in nm. As shown in FIG. 2, as the barrier/liner thickness (thickness of the bilayer 110) increases towards 4-5 nm which is the current regime in conventional fabrication techniques, the line resistance increases significantly starting about 3 nm for any of the three widths 28 nm, 16 nm, and 12 nm (e.g., 50-75% for 28 nm width, 150-225% for 16 nm width, and off the chart for 12 nm). This increases is contrasted with a 2D material of the present disclosure ($TaS_x$) which has been shown to effectively perform the functionality of the diffusion barrier bilayer 110 but have a thickness of only between about 0.7 nm to 1.5 nm, with respect to which, the line resistance of the interconnect increases quote moderately (between about 5-10% for the 28 nm width, 5-25% for the 16 nm width, and 5-30% for the 12 nm width.

Thus, according to the present disclosure a novel approach is presented that replaces TaN/Ta, representing the current standard for integrated circuit fabrication industry for diffusion barrier-adhesion material for interconnects, to a 2D layered material, namely tantalum sulfide ($TaS_x$), to serve as an ultra-thin 2D structure barrier that needs no additional adhesion layer. The about 0.7 nm thick polycrystalline $TaS_x$ film is deposited on substrates at temperatures that are compatible with ban-end-of-line (BEOL) technology. The present disclosure provides comparison between (i) Ta and $TaS_x$ for adhesion properties and (ii) TaN and $TaS_x$ for diffusion barrier properties. As discussed above, actual reduction to practice of $TaS_x$ structures provide good results showing the $TaS_x$ structure provide both superior liner and barrier properties simultaneously, all the while reducing the thickness to allow significant more copper metal deposition. These results are found in contrast to the conventional TaN/Ta diffusion barrier layer-adhesion layer which includes two layers each thicker than the single or double layers of the TaSx of the present disclosure as shown in FIG. 2, which is a graph of barrier/liner (i.e., TaN/Ta in case of the conventional approach) vs. line resistance increase (as a measure of percentage increase) for different wire thicknesses (the direction of arrow shows decreasing wire thicknesses). In the lower barrier/liner thickness zone (i.e., 0.5-1.5 nm), the material in the highlighted strip is considered to be in the 2D range. The highlighted portion on the right represents the conventional barrier/liner (i.e., TaN/Ta) which is in the range of 4-5 nm.

Figure 3:
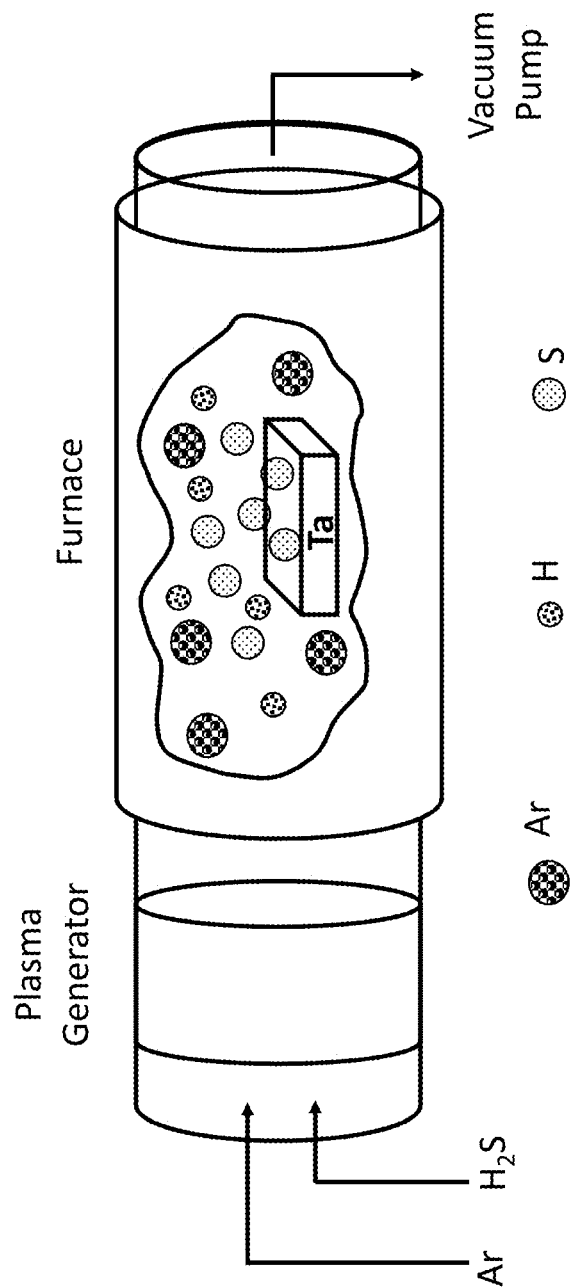
FIG. 3 is a schematic of a fabrication setup of the novel diffusion barrier of the present disclosure showing a chemical vapor deposition chamber equipped with a plasma generator and a furnace.
Figure 4:
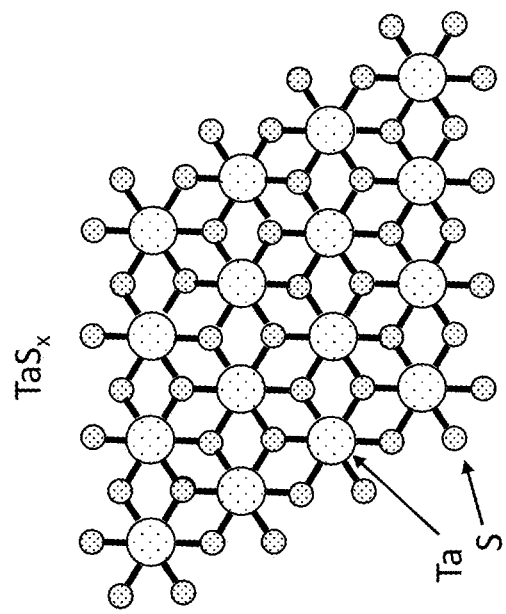
FIG. 4 is a chemical schematic of Ta atoms shown to make a crystalline structure with S radicals.
Figure 4:
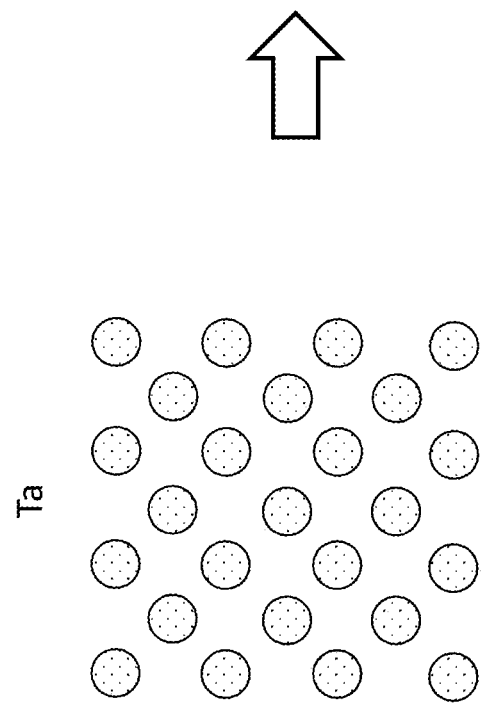

While, as discussed in the background section, some investigators had attempted to make 2D structures in order to maximize copper interconnect volume, such efforts required processing that were incompatible with BEOL processes. To this end, according to the present disclosure a different process and material are chosen as compared to the prior art. In particular, $TaS_x$ is chosen (where x is between 1.5-2.5) as the barrier/liner material while plasma-enhanced-chemical-vapor-deposition (PECVD) is chosen as the BEOL-compatible process. The PECVD process is run a lower temperature since it uses plasma. Referring to FIG. 3, a schematic of the fabrication setup of the novel diffusion barrier is presented showing a chemical vapor deposition chamber equipped with a plasma generator and a furnace, wherein a window is cut open to show the interior of the chamber showing Ar atoms (provided as an input to the chamber) as well as hydrogen and sulfur radicals (disassociated from $H_2S$ which was provided as input to the chamber). By utilizing the system of FIG. 3, actual reduction to practice was made possible for centimeter-scale, uniform $TaS_x$ prepared by converting a polycrystalline Ta film in a hot-zone furnace as illustrated in FIG. 3. A Ta film was pre-deposited on a $Si/SiO_2$ substrate by an e-beam evaporator technique, known to a person having ordinary skill in the art. Hydrogen sulfide ($H_2S$) was used as the precursor while Ar was used as the carrier gas. The flow rates for both gases were about 10 sccm. The growth temperature was set at about 400° C. The growth time was set at about 20 minutes. The plasma power was set at about 70-80 W. During the growth process, the remote plasma dissociate $H_2S$ into H and S radicals. S radicals react with Ta and convert Ta to $TaS_x$, resulting in a $TaS_x$ film. The mechanism of conversion is illustrated in FIG. 4 where schematically Ta atoms are shown to make a crystalline structure with S radicals. An example is 1T-tantalum disulfide ($TaS_2$).

Figure 5:
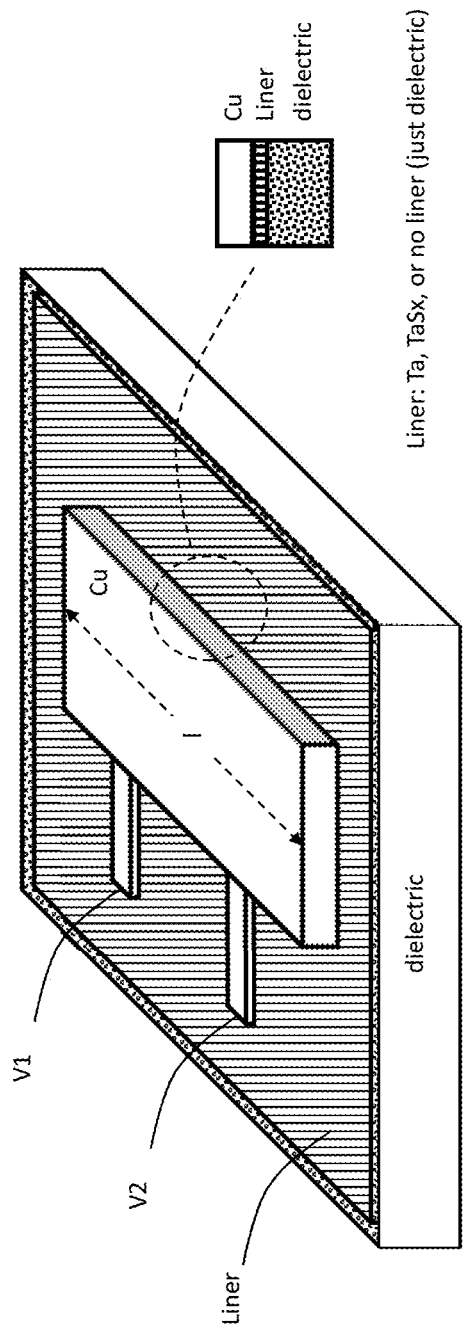
FIG. 5 is a perspective view of an experimental setup for a surface scattering measurement.
Figure 6:
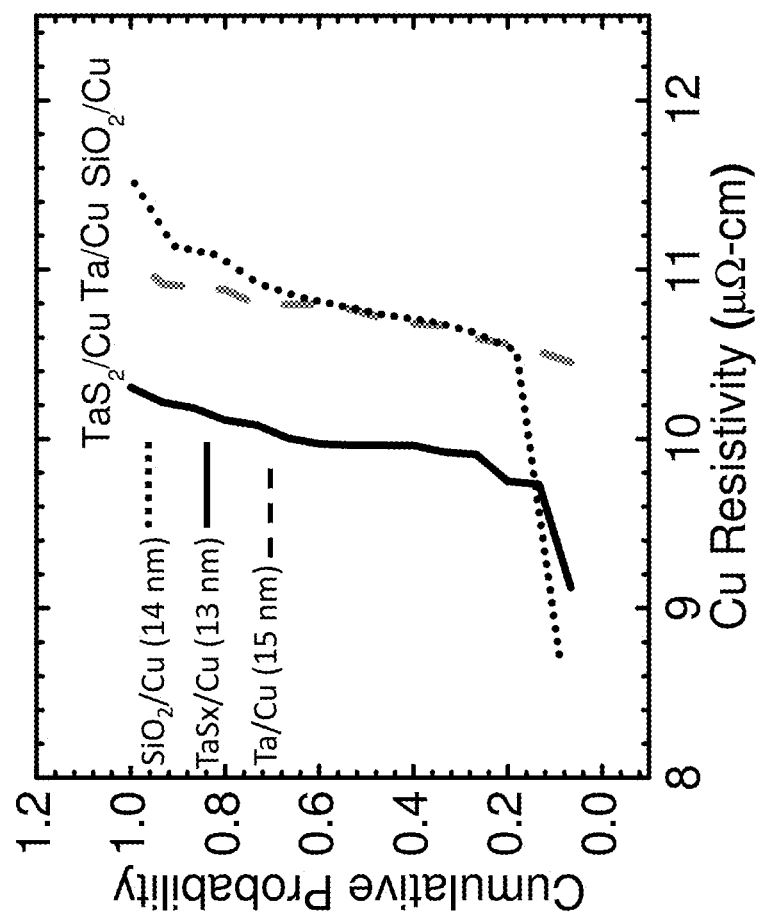
FIG. 6 represent graphs of cumulative probability vs. copper resistivity measured in $\mu\Omega$-cm is shown.

To understand the interface between $TaS_x$ and copper, the impact of $TaS_x$ on the surface scattering of copper interconnects was first studied. Towards this goal, the surface scattering at the $SiO_2$/Cu, Ta/Cu, and $TaS_x$/Cu interfaces were studied. Ultra-thin Cu films with thicknesses of about 15 nm were deposited on exemplary surfaces such as $SiO_2$, Ta, and $TaS_x$. Thin films of copper were provided in Kelvin structures, known to a person having ordinary skill in the art, for accurate resistance measurements, as illustrated in FIG. 5 which is a perspective view of an experimental setup for the aforementioned surface scattering measurements. In this set up, a dielectric $Si/SiO_2$ is provided as a base, on which a liner is optionally placed (the liner can be Ta or $TaS_x$), and on top of the liner is a layer of copper as discussed above. The resistivity of the devices shown in FIG. 5 were measured and the results are presented in FIG. 6. Referring to FIG. 6, graphs of cumulative probability vs. copper resistivity measured in $\mu\Omega$-cm is shown. While for macro-structures resistivity is a function of material properties, in ultra-small dimensions, such as the dimensions discussed herein, resistivity changes with changes in dimensional scales. For example, resistivity increases as dimensions decreases in these ultra-small dimensional regimes. Therefore, while Cu resistivity increases as corresponding dimensions decrease, the Cu with smallest dimension (13 nm) on $TaS_x$ has the lowest resistivity among the three groups, indicating a more specular/elastic interface scattering. The inferior conductivity of Ta/Cu and $SiO_2$/Cu are attributed to the perturbing localized interfacial states. Conversely, the weaker interaction between 2D layered materials and Cu results in a diminished perturbation at the interface. AS a result, the Cu/$TaS_x$ results in a more robust resistivity and thus resistance for the copper interconnect.

In addition to the surface scattering discussion provided above, two other attributes play important roles in choice of TaSx as the material of choice for the interconnect material. The two additional attributes are wettability and adhesion of Cu to $TaS_x$. Wettability is an attribute in order to provide a good surface for the Cu seeding layer. Wettability is also important for the subsequent electroplating of Cu. Adhesion is important for Cu to survive chemical-mechanical polishing (CMP) processes. Adhesion also effects electromigration lifetime of Cu wires.

Figure 7:
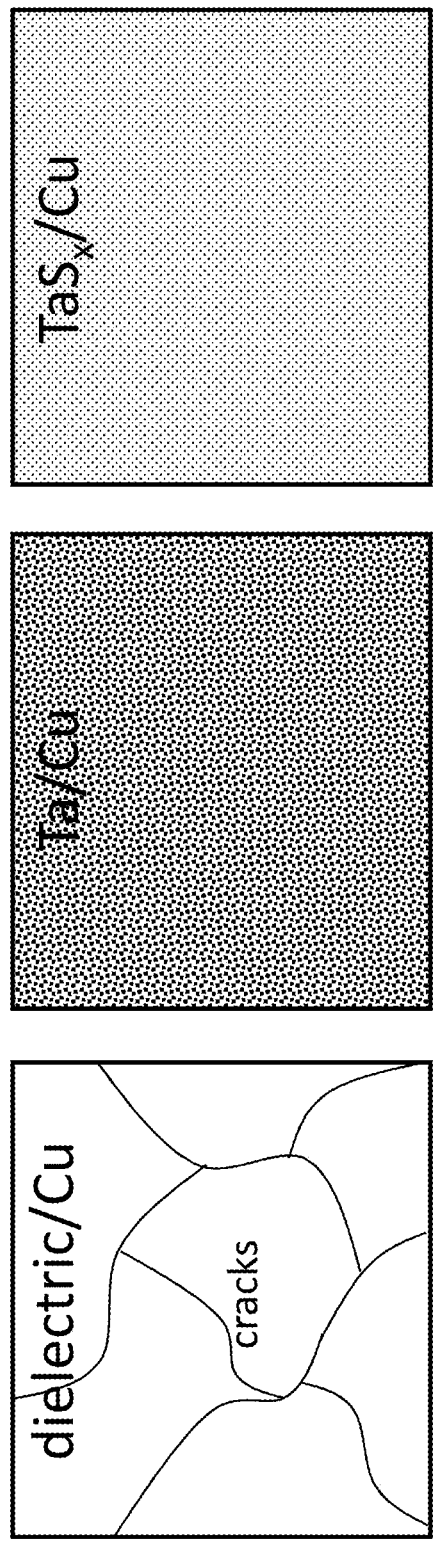
FIG. 7 represent schematic depiction of wettability experiments for Cu formed on dielectric, Cu formed on Ta, and Cu formed on $TaS_x$.

In order to determine how $TaS_x$ affects wettability, ultra-thin films of Cu (about 10 nm) were deposited on different surfaces. Referring to FIG. 7, results of these test are shown. FIG. 7 includes three panels which show Cu on $SiO_2$, a dielectric (left panel), Cu on Ta (middle panel), and Cu on $TaS_x$. Inspecting FIG. 7, the left panel shows many cracks on the Cu film deposited on $SiO_2$ (i.e., no liner. These cracks represent poor wettability for Cu on $SiO_2$. In comparison, Cu on Ta and Cu on $TaS_x$ both exhibit good wettability (middle and right panels, respectively). Therefore, the wettability test indicates as good of performance as industry standard (i.e., Ta) for adhesion layer as that for $TaS_x$.

Figure 8A:
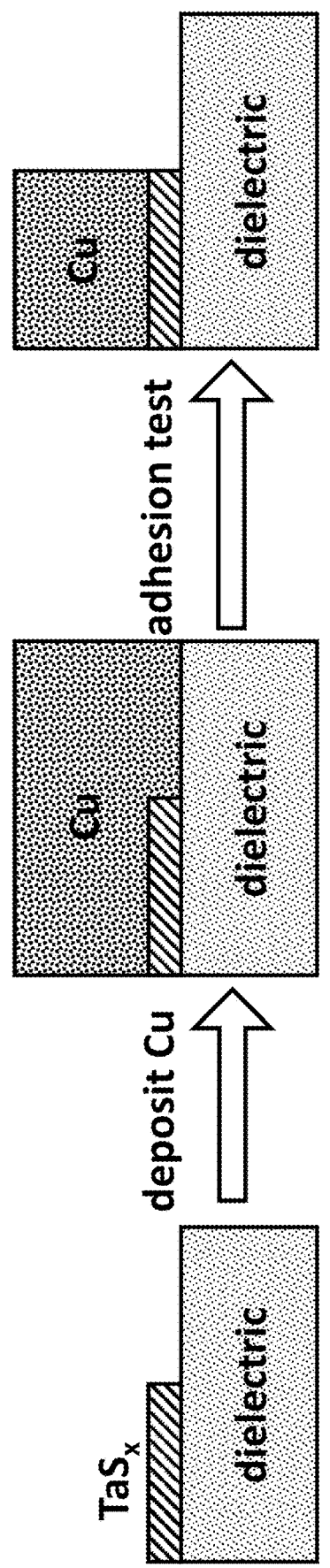
FIG. 8a represent a series of schematics showing an adhesion test, according to the present disclosure.
Figure 8B:
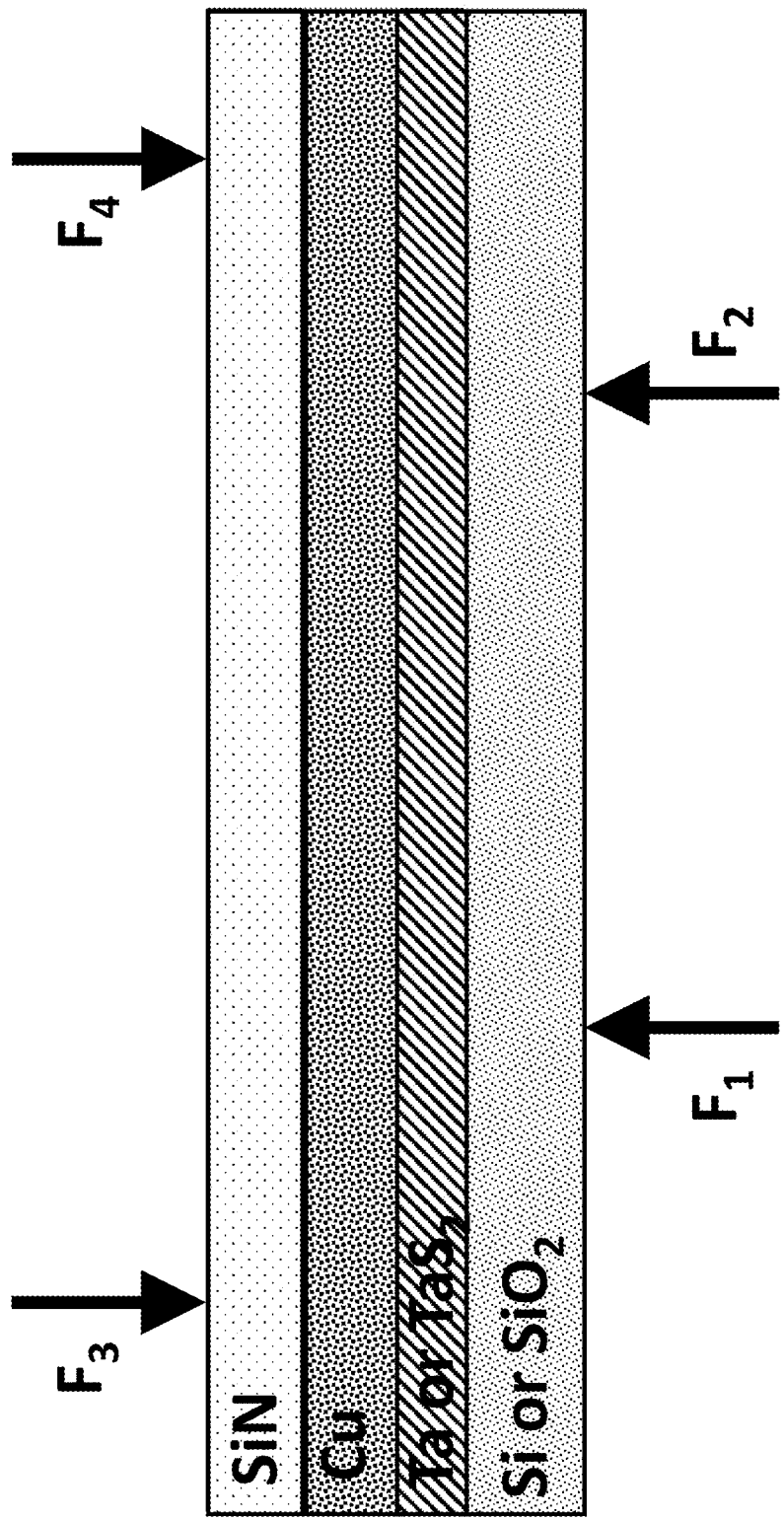
FIG. 8b is a schematic of a test setup for a 4-probe bending test.

In order to determine adhesion properties of $TaS_x$, a tape test method, known to a person having ordinary skill in the art. In this test, after a thin layer of Cu is deposited on a surface it is picked up using an adhesive tape. The adhesion test evaluates how much of the Cu layer separates from the test surface. In this case, after $TaS_x$ has been prepared partially on the $SiO_2$ substrate, about 80 nm of Cu is deposited on $TaS_x$ and $SiO_2$. Thereafter, a length of 3M Scotch Tape is used for the aforementioned adhesion test. After the tape is picked up, as shown in FIG. 8a (a series of schematics showing the adhesion test), Cu was picked up from all areas except for areas with $TaS_x$. As shown in the right panel of FIG. 8a, Cu on $SiO_2$ regions was detached by the tape, while Cu remained on the $TaS_x$.

Since wettability of Cu/$TaS_x$ is as good as industry standard (Cu/Ta) and since adhesion test shows robust adhesion between Cu and Cu/$TaS_x$, in totality, $TaS_x$ is a good candidate for a Cu as an interconnect metal.

Lastly, in order to show as good of diffusion barrier attribute as the industry standard (TaN) for $TaS_x$, a time-dependent dielectric breakdown (TDDB) measurements methodology, known to a person having ordinary skill in the art was used. TDDB measurement is a standard test method to evaluate gate dielectric reliability as well as Cu diffusion in the dielectrics or IMDs of interconnects. To this end, a capacitor structure is utilized for TDDB measurements to study the intrinsic diffusion barrier properties of $TaS_x$. Breakdown resulting from the CMP process (discussed above) can occur in interconnect damascene structures. Such breakdowns affect choice of a new material for the diffusion barrier property. Thus, in totality the TDDB measurements as well as the adhesion and wettability measurements for $TaS_x$ show it to be as good or even better than TaN/Ta, the industry standard for a diffusion barrier layer and adhesion layer.

Figure 9:
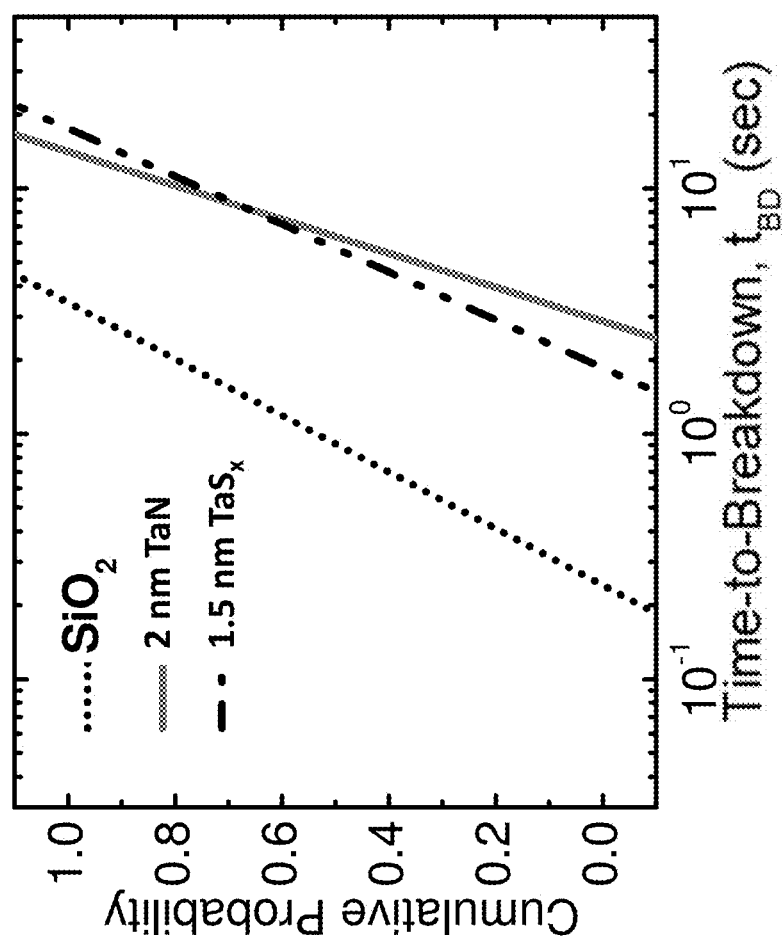
FIGS. 9 and 10 represent graphs of cumulative probability vs. time-to-breakdown, ($t_{BD}$) in seconds (industry standard approach for showing diffusion activity) for $TaS_x$ compared to TaN with a thickness of 2 nm and $SiO_2$ in FIG. 9, and compared to Ta with thicknesses of 1.5 nm and 3 nm in FIG. 10 with $TaS_x$ having a thickness of 1.5 nm.
Figure 10:
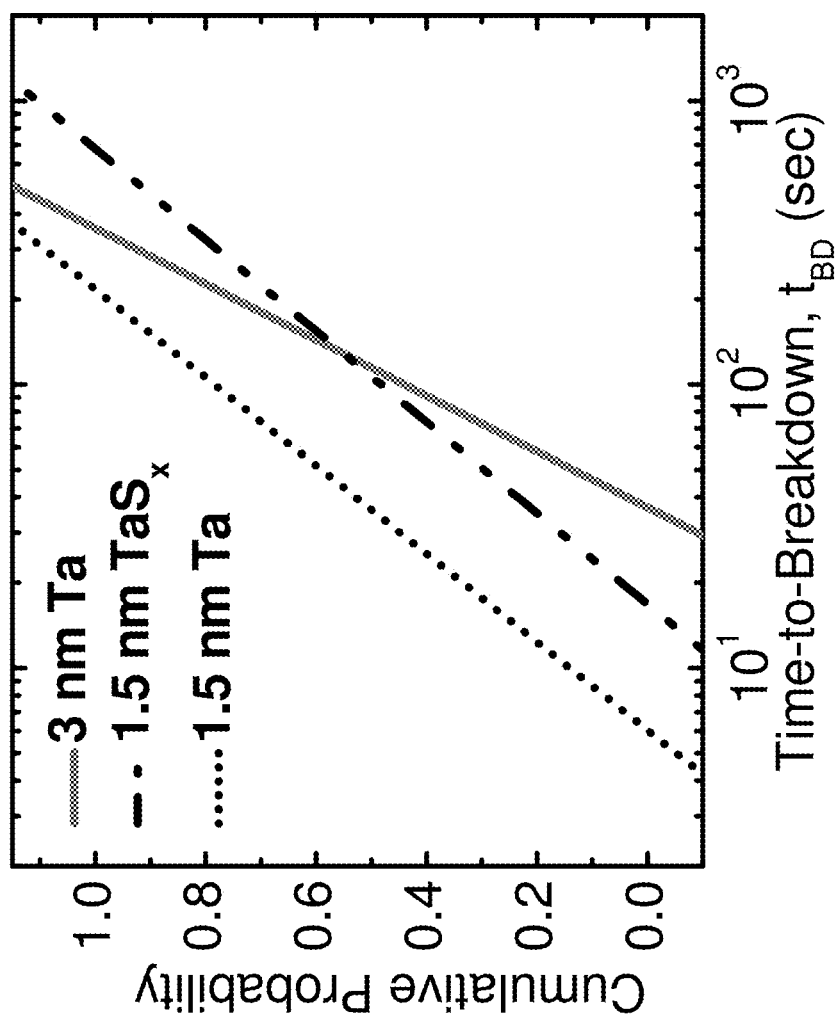

It is understood that TaN in the TaN/Ta bilayer discussed above, provides the primary function of diffusion barrier of Cu into the dielectric, while Ta primarily functions as an adhesion layer. However, it is also understood that Ta may also provide some diffusion barrier functionality. FIGS. 9 and 10 provide graphs of cumulative probability vs. time-to-breakdown, ($t_{BD}$) in seconds (industry standard approach for showing diffusion activity) for $TaS_x$ compared to TaN with a thickness of 2 nm and $SiO_2$ in FIG. 9, and compared to Ta with thicknesses of 1.5 nm and 3 nm in FIG. 10 with $TaS_x$ having a thickness of 1.5 nm. Inspecting FIGS. 9 and 10, the graphs indicate that $TaS_x$ with a thickness of 1.5 nm performs as good as TaN with a thickness of 2 nm and as good as Ta for a thickness of 3 nm (said thicknesses for TaN and Ta being necessary to ensure proper bilayer structure discussed above).

Based on the experimental results shown in FIGS. 9 and 10, then, comparing $TaS_x$ diffusion barrier qualities to that of TaN and Ta in bilayer structure, the present disclosure proposes a 5 nm TaN/Ta stack (2 nm TaN+3 nm Ta) can be substituted with a 3 nm $TaS_x$ layer or thinner—a further improvement of film quality can reduce $TaS_2$ thickness to 0.7 nm (single-layer $TaS_2$) while maintaining or even improving the barrier/liner performance of 5 nm TaN/Ta bilayer.

Figure 11:
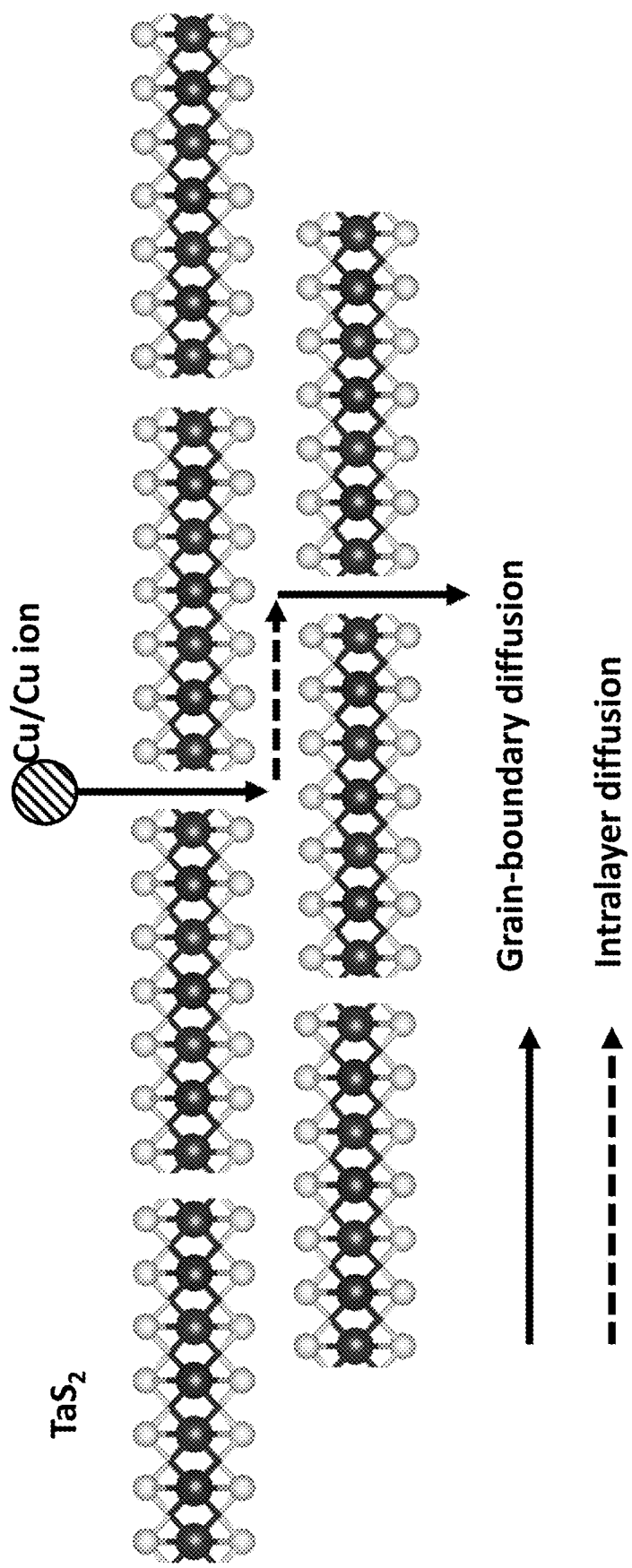
FIG. 11 is a schematic of molecular interactions of Cu or Cu ions with $TaS_2$ in the forms of grain boundary diffusion and interlayer diffusion.
Figure 12:
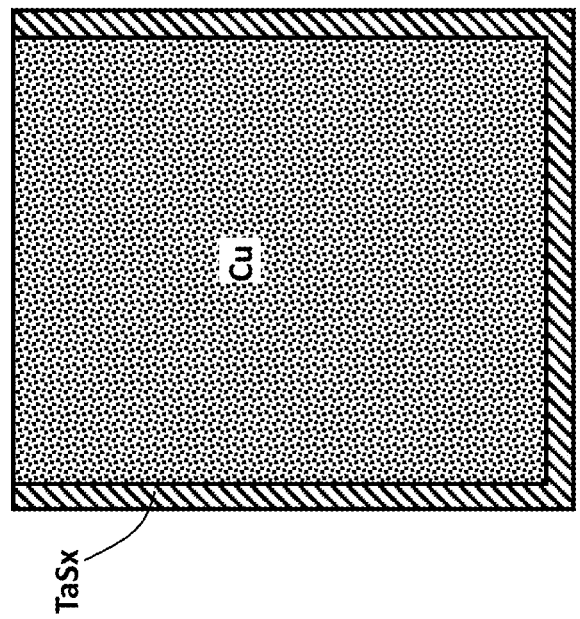
FIG. 12 are cross-sectionals view of damascene trenches (prior art in the left panel and the novel arrangement of the present disclosure in the right panel), where in the right panel the thinner $TaS_x$ results in a much larger copper volume.
Figure 12:
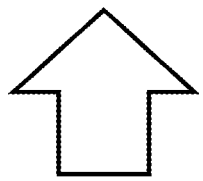
Figure 12:
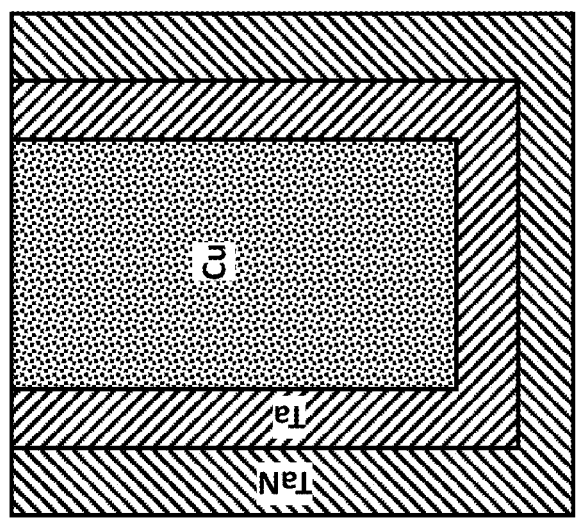

Energy barrier of $TaS_2$ is comparable to TaN while providing significant reduction in thickness. Further scaling can be achieved given the 2D material nature of $TaS_x$. A graphical explanation for the higher energy barrier is provided in FIG. 11, where a schematic of molecular interactions of Cu or Cu ions with $TaS_2$ in the forms of grain boundary diffusion and interlayer diffusion is shown. Thus, a schematic of the aforementioned significant resistance reduction benefitting owing to enlargement of Cu volume is provided in FIG. 12, where in the left panel, the prior art Ta/TaN is shown as the diffusion/adhesion layers and in the right panel and thinner $TaS_x$ only layer is shown as the diffusion barrier resulting in a much larger copper volume.

The novel material of the present disclosure is made according to the following non-limiting exemplary method. As an initial step, Ta is deposited using an e-beam evaporator process, known to a person having ordinary skill in the art. This deposition step deposits Ta on $Si/SiO_2$ as a substrate. Next, the substrate with Ta deposited thereon, is placed into a PECVD chamber (see FIG. 3). Thereafter, the furnace (shaped in the form of a tube) is pumped down to about 10 mTorr. Thereafter, nitrogen is pumped through the furnace to purge any unwanted gases. These steps of pumping down and purging using nitrogen are repeated a plurality times (e.g., ten times) to remove moisture, unwanted gases and particles, and other possible contamination that might have been introduced from ambient during the sample loading step. At the same time as the pump down/purging process is repeated, the temperature of the furnace is set at about 200 to 800° C. or for BEOL-compatible processes 400° C. This temperature can be in a bout 5-10 minutes depending on the furnace. Once the desired temperature is reached, the furnace is pressurized to a base pressure of about 10 mTorr. At the same time, Ar at a flow rate of about 10 sccm to about 100 sccm is introduced into the furnace. With increasing temperature pressure at within the chamber raises to about 180 mTorr. Thereafter, $H_2S$ with a flow rate of 10 sccm is introduced allowing the pressure to reach about 320 mTorr from 180 mTorr. After waiting for about 5 minutes to allow stabilization of temperature and flow rate, plasma power is activated and slowly allowed to increase to about 70 W. With the application of plasma, the pressure increases from 180 mTorr to about 420 mTorr. At this point, $H_2S$ reacts with Ta to generate $TaS_x$. After about 20 minutes of reaction and therefore growth, the plasma is turned off, followed by turning off the gases and the furnace heater.

It should also be appreciated that Ta and Ti represent choices of materials used in interconnect structures, as known to a person having ordinary skill in the art. As such other suitable materials based on the present disclosure are within the scope of the present disclosure. In particular, it is within the scope of the present disclosure to substitute $TaS_2$ with other compounds with similar structures. Examples include $TaSe_2$, $TaTe_2$, $TiS_2$, $TiSe_2$, and $TiTe_2$. These compounds behave in similar fashion as TaSx in providing as good or better diffusion barrier, wettability, and adhesion as TaN/Ta, but at a smaller thickness, allowing a larger copper volume in the damascene trench.

Those having ordinary skill in the art will recognize that numerous modifications can be made to the specific implementations described above. The implementations should not be limited to the particular limitations described. Other implementations may be possible.

The invention claimed is:

1. A metal interconnect arrangement in an integrated circuit, comprising:
   a damascene trench, including
      a dielectric base, with a trench made therein,
      two two-dimensional diffusion barrier layers formed over the trench,
      a conductor layer formed atop the diffusion layer,
   wherein the two two-dimensional diffusion barrier layers substantially prevent diffusion of constituents of the conductor layer into the dielectric base
   wherein each of the two two-dimensional diffusion barrier layers are a polycrystalline material selected from the group consisting of $TaSe_x$, $TaTe_x$, $TiS_x$, $TiSe_x$, $TiTe_x$, and $TaS_x$,
   wherein x is between 1.5-1.9, and
   wherein a grain in one of the two two-dimensional diffusion barrier layers is misaligned with an adjacent grain in the other of the two-dimensional diffusion barrier layers so that ions from the conductor layer would undergo both grain boundary diffusion and intralayer diffusion in order to diffuse through the boundary layer.

2. The metal interconnect arrangement of claim 1, wherein the dielectric base is $SiO_2$.

3. The metal interconnect arrangement of claim 1, wherein the conductor layer is copper.

4. The metal interconnect arrangement of claim 1 wherein thickness of each of the two two-dimensional diffusion barrier layers is about 0.7 nm.

5. The metal interconnect arrangement of claim 1, wherein the two two-dimensional diffusion barrier layers consists of two layer of said material.

6. The metal interconnect arrangement of claim 1, wherein diffusion barrier properties of the two two-dimensional diffusion barrier layers is about equal to a bilayer of TaN/Ta having a thickness of about 5 nm.

* * * * *

UNITED STATES PATENT AND TRADEMARK OFFICE
CERTIFICATE OF CORRECTION

PATENT NO. : 11,289,423 B2
APPLICATION NO. : 16/438093
DATED : March 29, 2022
INVENTOR(S) : Zhihong Chen and Chun-Li Lo Page 1 of 1

It is certified that error appears in the above-identified patent and that said Letters Patent is hereby corrected as shown below:

In the Specification

On Column 1, Line 6, under section titled "STATEMENT REGARDING GOVERNMENT FUNDING" and before section titled "TECHNICAL FIELD", please replace "This invention was not made with Government Support." with "This invention was made with government support under 70NANB17H041 awarded by the National Institute of Standards and Technology. The government has certain rights in the invention."

Signed and Sealed this
Fifth Day of December, 2023

Katherine Kelly Vidal
*Director of the United States Patent and Trademark Office*